(12) United States Patent
Gronenborn et al.

(10) Patent No.: US 9,099,834 B2
(45) Date of Patent: Aug. 4, 2015

(54) OPTICALLY PUMPED VERTICAL EXTERNAL-CAVITY SURFACE-EMITTING LASER DEVICE

(71) Applicant: KONINKLIJKE PHILIPS N.V., Eindhoven (NL)

(72) Inventors: Stephan Gronenborn, Eindhoven (NL); Michael Miller, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/396,655

(22) PCT Filed: Apr. 11, 2013

(86) PCT No.: PCT/IB2013/052879
§ 371 (c)(1),
(2) Date: Oct. 23, 2014

(87) PCT Pub. No.: WO2013/160789
PCT Pub. Date: Oct. 31, 2013

(65) Prior Publication Data
US 2015/0092802 A1 Apr. 2, 2015

Related U.S. Application Data

(60) Provisional application No. 61/638,540, filed on Apr. 26, 2012.

(51) Int. Cl.
*H01S 3/04* (2006.01)
*H01S 5/04* (2006.01)
(Continued)

(52) U.S. Cl.
CPC ............... *H01S 5/041* (2013.01); *G02B 17/06* (2013.01); *H01S 5/141* (2013.01);
(Continued)

(58) Field of Classification Search
CPC ............ H01S 5/02407; H01S 5/02461; H01S 5/02476; H01S 5/0282; H01S 5/0286; H01S 5/0287; H01S 5/0288; H01S 5/0424; H01S 5/0425; H01S 5/0604; H01S 5/0657; H01S 5/0683; H01S 5/1017; H01S 5/1042
USPC .................................. 372/36, 43.01, 50.124
See application file for complete search history.

(56) References Cited

U.S. PATENT DOCUMENTS 5,627,853 A * 5/1997 Mooradian et al. ............. 372/92
5,754,578 A * 5/1998 Jayaraman .................... 372/50.1
(Continued)

FOREIGN PATENT DOCUMENTS

EP 2299549 A1 3/2011
JP 02185082 A 7/1990

OTHER PUBLICATIONS

Kuznetsov, M. et al "High Power (>0.5-W CW) Diode-Pumped Vertical-External-Cavity Surface-Emitting Semiconductor Lasers with Circular TEM00 Beams", IEEE Photonics Technology Letters, vol. 9, No. 8, Aug. 1997. pp. 1063-1065.

*Primary Examiner* — Tod T Van Roy
*Assistant Examiner* — Vu A Vu

(57) ABSTRACT

The present invention relates to an optically pumped vertical external-cavity surface-emitting laser device comprising at least one VECSEL (200) and several pump laser diodes (300). The pump laser diodes (300) are arranged to optically pump the active region (108) of the VECSEL (200) by reflection of pump radiation (310) at a mirror element (400). The mirror element (400) is arranged on the optical axis (210) of the VECSEL (200) and is designed to concentrate the pump radiation (310) in the active region (108) and to form at the same time the external mirror of the VECSEL (200). The proposed device avoids time consuming adjustment of the pump lasers relative to the active region of the VECSEL and allows a very compact design of the laser device.

10 Claims, 5 Drawing Sheets

(51) Int. Cl.
  H01S 5/14 (2006.01)
  H01S 5/42 (2006.01)
  G02B 17/06 (2006.01)
  *H01S 3/08* (2006.01)
  *H01S 5/00* (2006.01)
  *H01S 5/022* (2006.01)
  *H01S 5/024* (2006.01)
  *H01S 5/026* (2006.01)
  *H01S 5/183* (2006.01)

(52) U.S. Cl.
  CPC ............ H01S 5/18397 (2013.01); H01S 5/423 (2013.01); *H01S 3/08068* (2013.01); *H01S 5/0071* (2013.01); *H01S 5/026* (2013.01); *H01S 5/02252* (2013.01); *H01S 5/02476* (2013.01); *H01S 5/18305* (2013.01); *H01S 5/18388* (2013.01)

(56) References Cited

U.S. PATENT DOCUMENTS

| | | | |
|---|---|---|---|
| 2002/0075934 A1 | 6/2002 | Ludewigt | |
| 2010/0014547 A1* | 1/2010 | Cabaret | 372/34 |
| 2010/0303113 A1* | 12/2010 | Joseph | 372/36 |
| 2011/0268143 A1* | 11/2011 | Strittmatter et al. | 372/36 |

* cited by examiner

OPTICALLY PUMPED VERTICAL EXTERNAL-CAVITY SURFACE-EMITTING LASER DEVICE

CROSS-REFERENCE TO PRIOR APPLICATIONS

This application is the U.S. National Phase application under 35 U.S.C. §371 of International Application No. PCT/IB013/052879, filed on Apr. 11, 2013, which claims the benefit of U.S. Provisional Patent Application No. 61/638,540, filed on Apr. 26, 2012. These applications are hereby incorporated by reference herein.

FIELD OF THE INVENTION

The present invention relates to an optically pumped vertical external-cavity surface-emitting laser device comprising at least one vertical external-cavity surface-emitting laser (VECSEL) and several pump laser diodes, wherein said pump laser diodes are arranged to optically pump an active region of the VECSEL by reflection of pump radiation at a mirror element. Vertical external-cavity surface-emitting lasers are one of the most promising high brightness laser sources and offer many advantages compared to edge-emitters, like addressable 2D-array arrangements and circular beam shapes.

BACKGROUND OF THE INVENTION

VECSELs typically comprise a first end mirror and an active region formed in a layer sequence, and a second end mirror arranged separated from the layer sequence and forming an external cavity of the laser. In standard setups the external cavity is composed of macroscopic optical elements, which are very bulky and need involved adjustment. By realizing the external optical components from a wafer and bonding this wafer to the wafer carrying the layer sequence, which is typically a GaAs wafer, it is possible to manufacture many thousands of micro-VECSELs in parallel and test them directly on the wafer like VCSELs (vertical cavity surface emitting laser diodes).

Known optically-pumped VECSELs need separated mounting and alignment of the pump lasers to the resonator or cavity of the VECSEL. This requires time-consuming production and bulky modules.

US 20100014547 A1 discloses a device for longitudinal pumping of a solid state laser medium. This device comprises several pump laser diodes which are mounted on side faces of a cooling device of the laser medium. The pump radiation emitted by the laser diodes is reflected by several parabolic mirrors toward one of the end faces of the solid state laser medium. In this device the several parabolic mirrors have to be precisely aligned in order to achieve the desired intensity distribution of the pump radiation at the entrance of the solid state laser medium.

SUMMARY OF THE INVENTION

It is an object of the present invention to provide an optically pumped vertical external-cavity surface-emitting laser device which allows easier alignment of the pump optics and can be realized in a compact design.

The object is achieved with the optically pumped vertical external-cavity surface-emitting laser device according to claim 1. Advantageous embodiments of the device are subject matter of the dependent claims or are described in the subsequent portions of the description and preferred embodiments.

The proposed optically pumped vertical external-cavity surface-emitting laser device comprises at least one VECSEL as optically-pumped semiconductor disk laser and several pump laser diodes, preferably vertical cavity surface-emitting laser diodes (VCSELs). The VECSEL can be designed in a known manner and comprises a layer stack forming at least a first end mirror and an active region of the VECSEL. A second end mirror arranged separated from the layer stack forms the external cavity of the laser. In the proposed design of the laser device the pump laser diodes are arranged to optically pump the active region of the VECSEL by reflection of pump radiation at a mirror element. The mirror element is arranged on the optical axis of the VECSEL and is designed to concentrate the pump radiation in the active region and to form at the same time the second end mirror of the VECSEL. The mirror element thus incorporates two functions in one single element.

The vertical external-cavity surface-emitting laser device of the present invention uses an appropriately designed mirror element which directs the pump light into the active region of the VECSEL and acts as the external mirror forming the VECSEL resonator together with the first mirror at the same time. Thus, the pump spot is automatically aligned with the optical mode of the VECSEL resonator. By designing the optically pumped area of the active region of the VECSEL sufficiently large (large cross section perpendicular to the optical axis), alignment tolerances of up to 100 µm of the pump laser diodes can be realized. The proposed design allows an arrangement of the pump laser diodes to direct the pump radiation substantially parallel to the optical axis towards the mirror element which allows a very compact design of the device. The pump laser diodes are preferably realized by an array of VCSELs which can be tested on wafer-level and provide good efficiency. In addition, in an advantageous embodiment of the invention, the pump laser diodes are integrated on the same chip as the VECSEL layer stack. This reduces manufacturing costs and dimensions of the laser device while offering exceptional brightness.

The integration of the array of VCSELs and the VECSEL on the same chip allows the manufacturing of these lasers originating from the same layer sequence on the chip. To this end a common layer structure is applied in which the sequence of layers forming the VCSELs is separated by an etch stop layer from the sequence of layers forming the VECSEL layer stack. The VCSELs and VECSEL are then formed by appropriately structuring the layer sequence through one or several etch processes.

It is also possible to integrate the pump laser diodes and the VECSEL on separate chips which can then be mounted on a common sub-mount or heat sink. Such an arrangement also offers the advantage of a very compact design of the laser device.

The mirror element forming the external mirror of the VECSEL may be mounted on the layer sequence of the VECSEL in the same manner as already known in the art. It is also possible to form several mirror elements on a separate wafer and then bond this wafer to the wafer comprising several of the VECSEL layer stacks together with the array of VCSELs. The bonded wafers are then separated into single chips comprising the proposed laser devices. Alternatively the two wafers can be first separated into single chips and the single chips can then be combined to achieve the proposed laser device. A further possibility is to directly integrate the mirror element on the chip or wafer comprising the VECSEL layer sequence.

The mirror element preferably comprises a central region which forms the external mirror and an outer region which is designed to reflect the pump radiation to the active region of the VECSEL. To this end the mirror element is preferably manufactured as a free-form optic allowing nearly any shape of the reflecting mirror surfaces in the central and outer regions of the mirror element. The outer region which preferably completely surrounds the central region may be designed to generate any desired intensity distribution of the pump radiation in the active region of the VECSEL matching the shape of the desired optical mode of the laser. Depending on the emission side of the VECSEL, the body of the mirror element may be formed of an appropriate material, for example of a metal, a coated glass or coated plastics. In case of a metal body, the reflecting surfaces of the mirror element may be formed of this metal, e.g. of polished aluminium. In case of a glass or plastic body, the mirror surface is formed by an appropriate metallic or dielectric coating as known in the art.

These and other aspects of the invention will be apparent from and elucidated with reference to the embodiments described herein after.

BRIEF DESCRIPTION OF THE DRAWINGS

The proposed solid state laser device is described in the following by way of examples in connection with the accompanying drawings in further detail. The figures show.

DETAILED DESCRIPTION OF EMBODIMENTS

Figure 1:
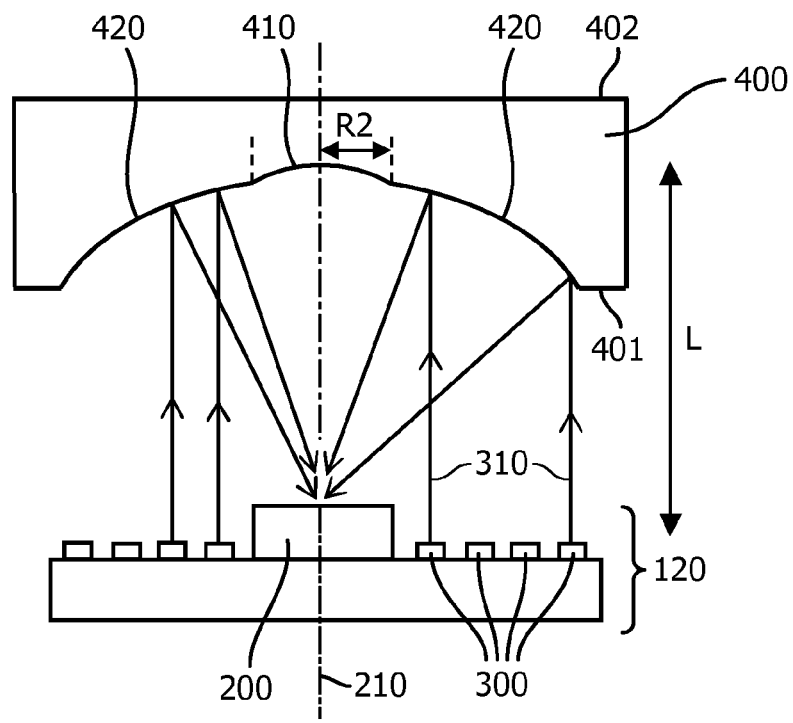
FIG. 1 a first example of the proposed laser device.
Figure 2:
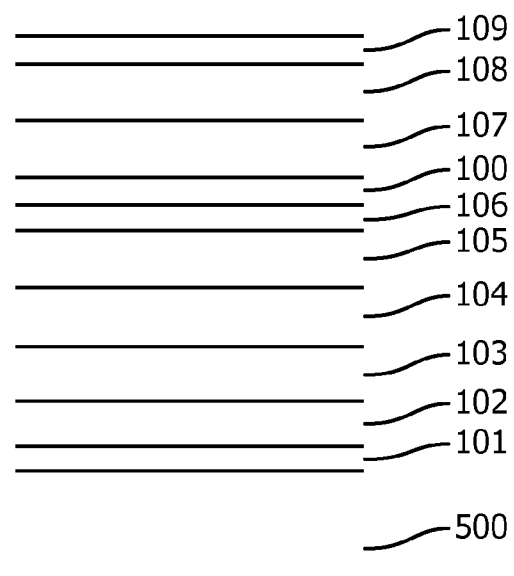
FIG. 2 an example of a layer sequence for manufacturing the proposed laser device.
Figure 3:
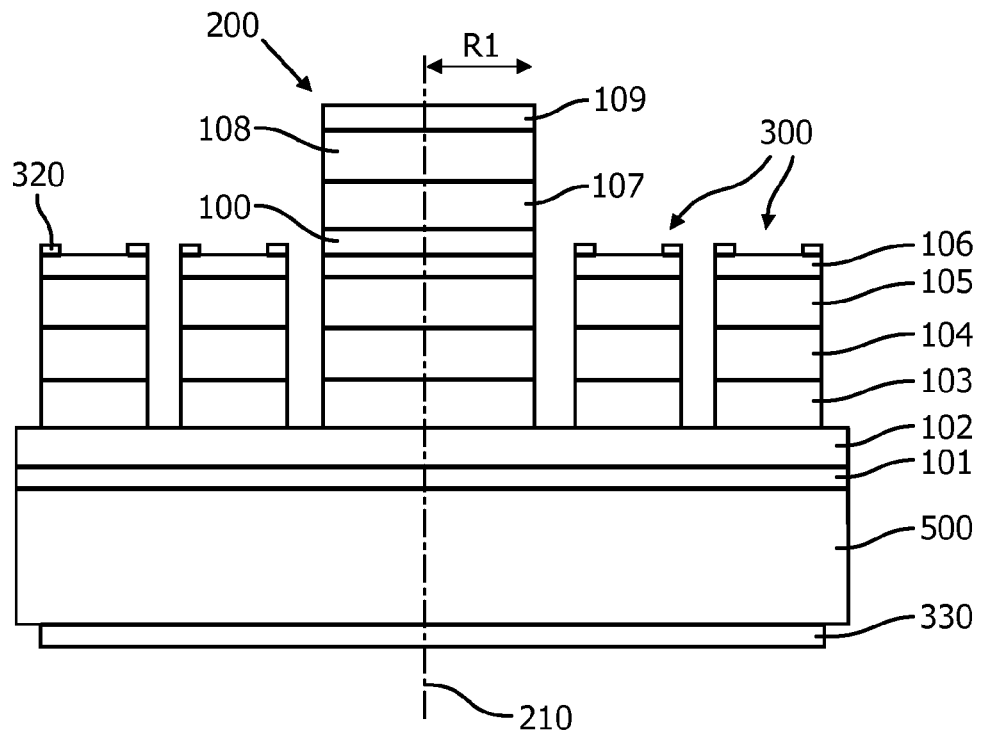
FIG. 3 an exemplary design of the VECSEL and VCSELs of the proposed laser device after structuring the layer sequence of FIG. 2.

FIGS. 1 to 3 show a first example of the proposed laser device and the manufacturing thereof. In this example, the pump laser diodes are VCSELs 300 which are integrated on the same chip 120 as the VECSEL 200. The VCSELs 300 are arranged to surround the VECSEL 200. In this embodiment all semiconductor lasers are top emitting lasers as indicated in FIG. 1. A mirror element 400 (free-form optic) containing at least two radial mirror regions 410, 420 is aligned in front of the semiconductor chip 120. In this embodiment, the mirror element 400 is formed of an optically transparent body consisting of a first surface 401 facing the semiconductor chip 120 and a second surface 402. The first surface 401 is coated to provide sufficient reflectivity for the laser operation of the VECSEL 200 ($R(\lambda_{VECSEL})$=80-99.5%) and reflection of the pump light of the VCSELs 300 as high as possible ($R(\lambda_{VCSEL})$>95%, preferably>99%). Surface 401 is divided in two regions with different shapes.

The center region 410 for r<$R_2$ forms the external VECSEL mirror and is usually a spherical mirror with a radius of curvature designed to produce a fundamental mode size $w_0$ in the active region of the VECSEL 200 in a distance L. The outer region 420 for r≥$R_2$ is designed to reflect the radiation 310 of the VCSELs 300 into the active region of VECSEL 200. This outer region 420 may be formed as a parabolic mirror with a radius of curvature equal to 2 L. $R_2$ is approximately equal to the radius $R_1$ of the cross section of the VECSEL 200 perpendicular to the optical axis 210 of the VECSEL 200 and should be larger than the mode size of the VECSEL laser radiation in the plane of the mirror element 400, but also small enough to collect all the light of the VCSELs.

As can be seen from FIG. 1, the pump radiation 310 emitted by the VCSELs 200 is directed by the outer region 420 of the mirror element 400 to the active region of the VECSEL 200 for optically pumping this laser. Due to this arrangement of the pump laser diodes 300 and the mirror element 400 a very compact design of the laser device is realized. A time consuming adjustment of the pump lasers relative to the VECSEL is not necessary, since the pump radiation is automatically centered into the active region of VECSEL 200 by the geometrical shape of the reflecting surface of mirror element 400.

The VCSEL array and the VECSEL(s) can also be formed on separate chips made from different epitaxy wafers and bonded to the same sub-mount or heat sink, and then combined with the optical element 400. This facilitates the wafer structures but increases mounting effort and module size.

FIGS. 2 and 3 schematically show a manner of manufacturing the laser device of FIG. 1. To this end, a layer sequence as shown in FIG. 2 is epitaxially grown on a wafer substrate. As an example, the structure for an epitaxy-side emitting VECSEL is described for n-doped substrates. Layer stacks for p-doped substrates and/or substrate-side emission can easily be derived from this. The structure of this embodiment comprises starting from the substrate 500:

an etch stop layer 101 (optional) which allows later removing of the substrate 500 for better heat sinking; this etch stop layer can also be omitted if the substrate 500 is not removed;

an n-doped current distribution layer 102 (optional) with high doping concentration;

an n-doped DBR 103 (Distributed Bragg Reflector) which later forms an end mirror of the VCSELs (R≥99.9%);

an active region 104 of the VCSELs as known in the art (e.g. 3 quantum wells, current confinement layers and oxide aperture);

a p-doped DBR 105 later forming an outcoupling mirror for the VCSELs (R approximately 99%);

a cap layer 106 for phase matching (semiconductor to air) as known for top-emitting VCSELs;

an etch stop layer 100 separating the VCSEL layer stack from the VECSEL layer sequence;

an undoped DBR 107 (optional) later forming the first end mirror of the VECSEL;

an active region 108 of the VECSEL as known from the art (several quantum wells in anti-nodes of the standing wave, with barrier layers, RPG structure (RPG: resonant periodic gain), optimized for in-well-pumping or barrier-pumping, . . . ); and a cap-layer 109 having an AR coating to air or etalon-layer for resonance enhancement or wavelength stabilization.

The resonance wavelength $\lambda_{VCSEL}$ of the VCSELs formed by the DBRs 103 and 105 is selected to be a bit shorter than the emission wavelength $\lambda_{VECSEL}$ of the VECSEL active region 108. In case of barrier-pumping, $\lambda_{VCSEL}$ has to be several tens of nanometers shorter than $\lambda_{VECSEL}$.

Etch stop layer 101 and current distribution layer 102 are only needed if the substrate 500 should be at least partially removed. The undoped DBR 107 is not necessary if the VECSEL wavelength is inside the stop-band of the p-DBR 105, but not exactly equals the resonance wavelength of the VCSEL cavity between 103 and 105. The p-DBR 105 in this case forms the first end mirror of the VECSEL. The additional undoped DBR 107 however, can reduce the optical losses in the VECSEL, but at the same time, the thermal resistance of the VECSEL is increased through this additional layer.

After growing such a layer structure, posts are etched down to etch stop layer 100 forming the region of VECSEL 200 with a diameter of $2*R_1$. Then the etch stop layer 100 is removed to expose the cap layer 106. In the next step one or several VCSELs 300 are processed next to the VECSEL region by mesa etch, oxidation, deposition of p-ring contacts and so on. The p-contacts can also be realized as vias through the substrate for flip-chip mounting.

The result of these processing steps is depicted in FIG. 3. A metal contact (n-contact) 330 is deposited on the n-side of the substrate 500.

Alternatively, substrate 500 can be removed by etching down to the etch stop layer 101 from the substrate side. Then the metal contact 330 is deposited on the n-layer 102.

After this processing the wafer is separated into single chips 120 and soldered n-side down on a heat sink.

Figure 4:
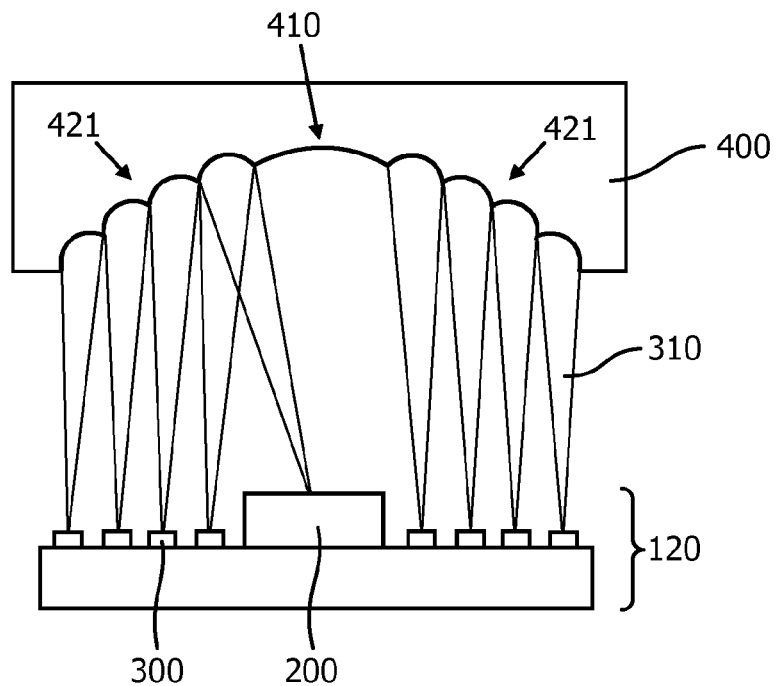
FIG. 4 a second example of the proposed laser device.

The mirror element 400 of the proposed laser device may be designed in any appropriate manner to fulfill the desired functions. The center region 410 may also be formed as a free-form mirror for mode shaping or mode selection of the VECSEL 200. The outer region 420 can also be realized e.g. as a free-form mirror 421 acting as an array of smaller mirrors collimating or focusing down the radiation beams 310 of the individual VCSELs as schematically indicated in FIG. 4. In another embodiment, the free-form mirror 421 can produce different pump spot diameters from the individual VCSELs 300 to shape the resulting total pump profile to any desired profile, e.g. a Gaussian profile.

The second surface 402 of the mirror element 400 may be AR-coated for the VECSEL wavelength and can be plane, spherical to collimate or focus the VECSEL laser beam or even be a second free-form surface to further shape the VECSEL laser beam.

The first surface 401 can be plane and AR-coated for the wavelength of the pump radiation and the wavelength of the VECSEL laser radiation and the second surface 402 can comprise the two regions 410 and 420 to be reflective coated. Then the mirror element 400 can also be integrated to the semiconductor chip on wafer level.

The two regions 410 and 420 can also be realized on two opposing sides of the optical element 400 with different coatings on both sides.

Figure 6:
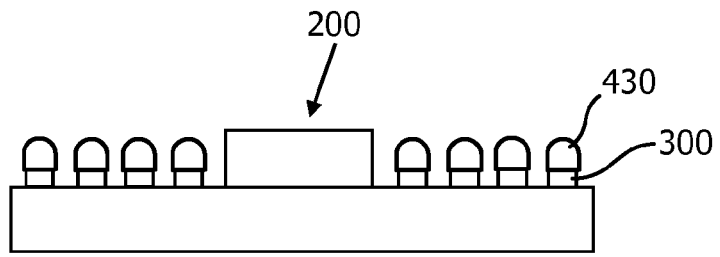
FIG. 6 a detail of a further embodiment of the proposed laser device.

As shown in FIG. 6, micro-lenses 430 can be formed on top of the VCSELs 300 to collimate the VCSEL pump radiation beams or focus them on the active region of the VECSEL 200. FIG. 6 shows only the detail of the micro-lenses on top of the VCSELs 300 of the proposed device.

Figure 5:
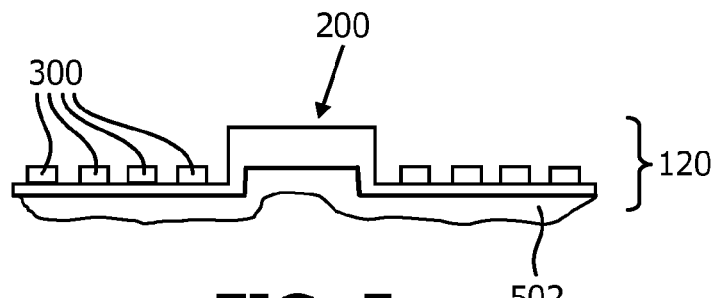
FIG. 5 a detail of a further embodiment of the proposed laser device.
Figure 7:
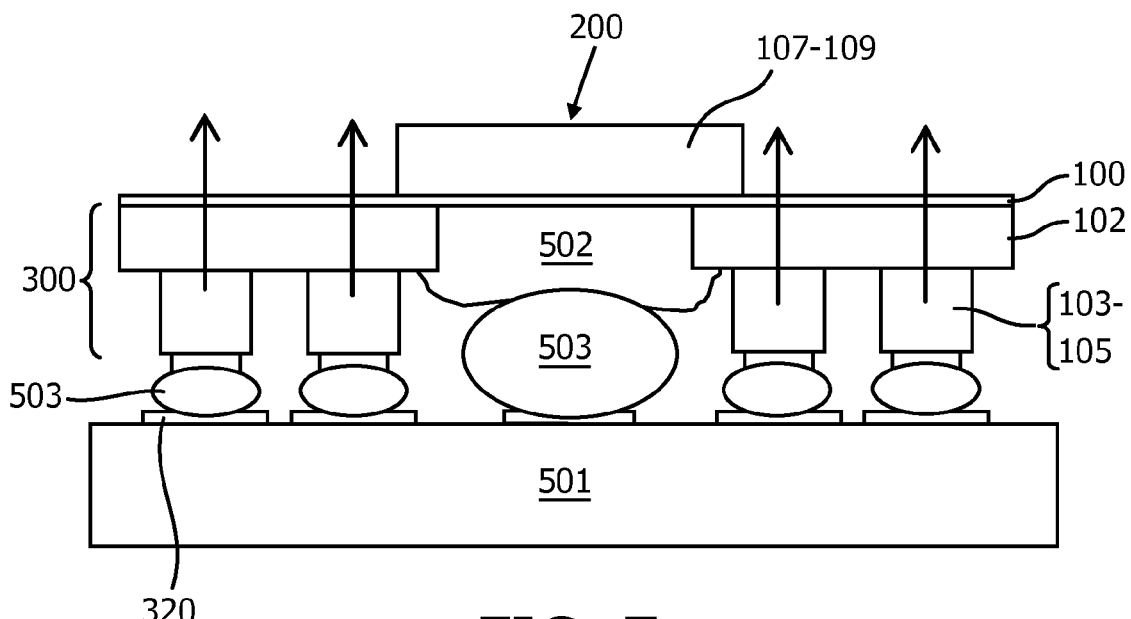
FIG. 7 a third example of a portion of the proposed laser device.

FIG. 5 shows an embodiment which is realized after removing the substrate of FIG. 3. After removing the substrate the layers 101 to 106 can also be removed below the region of the VECSEL 200 and filled with a highly thermally conductive material 502, e.g. Cu, Au or Ag for better heat sinking The chip with the VECSEL and pump VCSELs can also be realized in a different order having bottom-emitting VCSELs. An example is shown in FIG. 7. The reference numbers indicate the same layers as in FIG. 2. Again, a thermal via to the region of the VECSEL 200 filled with a highly thermally-conductive material 502 like a metal is possible for better heat sinking of this region. The complete chip 120 is soldered (solder 503) to a sub-mount or heat sink 501 in this example.

Figure 8:
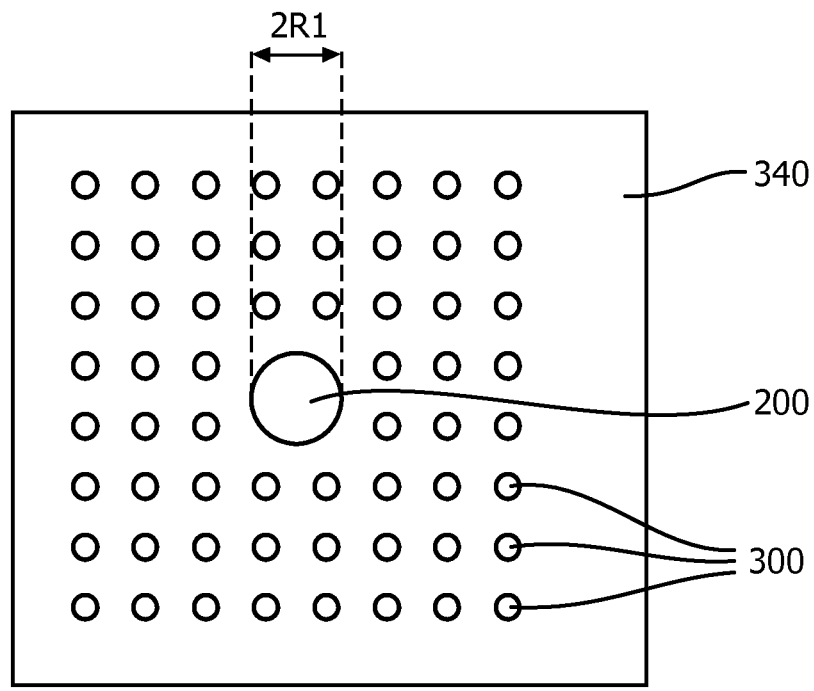
FIG. 8 a top view of an example of the proposed laser device.

FIG. 8 shows a top view of an example of the proposed laser device of FIG. 1. In this top view the pump laser array with the different VCSELs 300 can be recognized which surrounds VECSEL 200. The bond pad 340 for electrical contacting is arranged on the side area of the chip.

Figure 9:
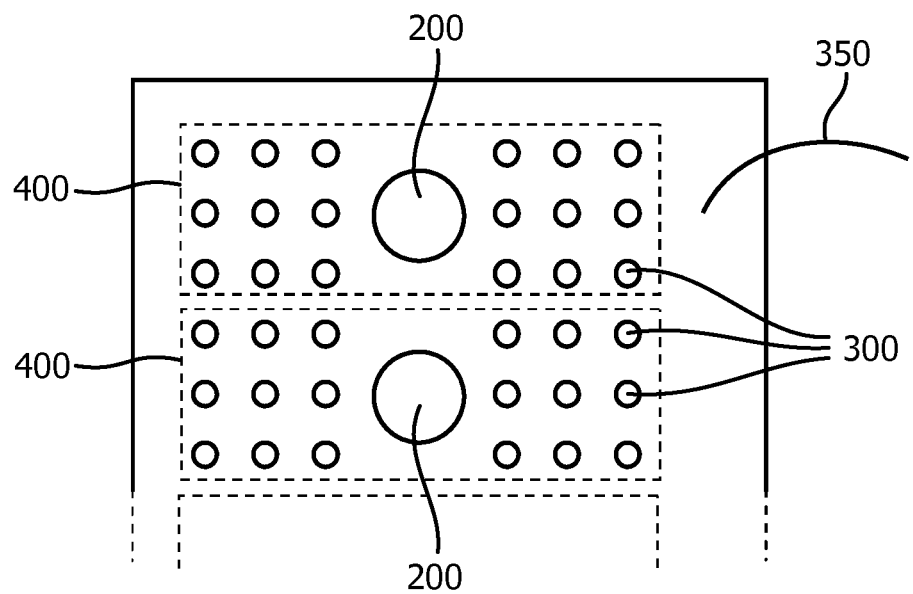
FIG. 9 a top view of a further example of the proposed laser device.

Several VECSELs 200 can also be realized on a single chip with pump VCSELs 300 corresponding to each of the VECSELs 200. This is schematically shown in the top view of FIG. 9. Each of the VECSELs 200 with its corresponding pump VCSELs 300 and bonding wires 350 comprises a mirror element directing the radiation of each pump array to the corresponding VECSELs 200. The mirror elements 400 are schematically indicated by the dashed line in FIG. 9. The pump regions can be individually addressable to achieve an addressable optically pumped VECSEL array, which may be used for printing, marking or similar applications.

Figure 10:
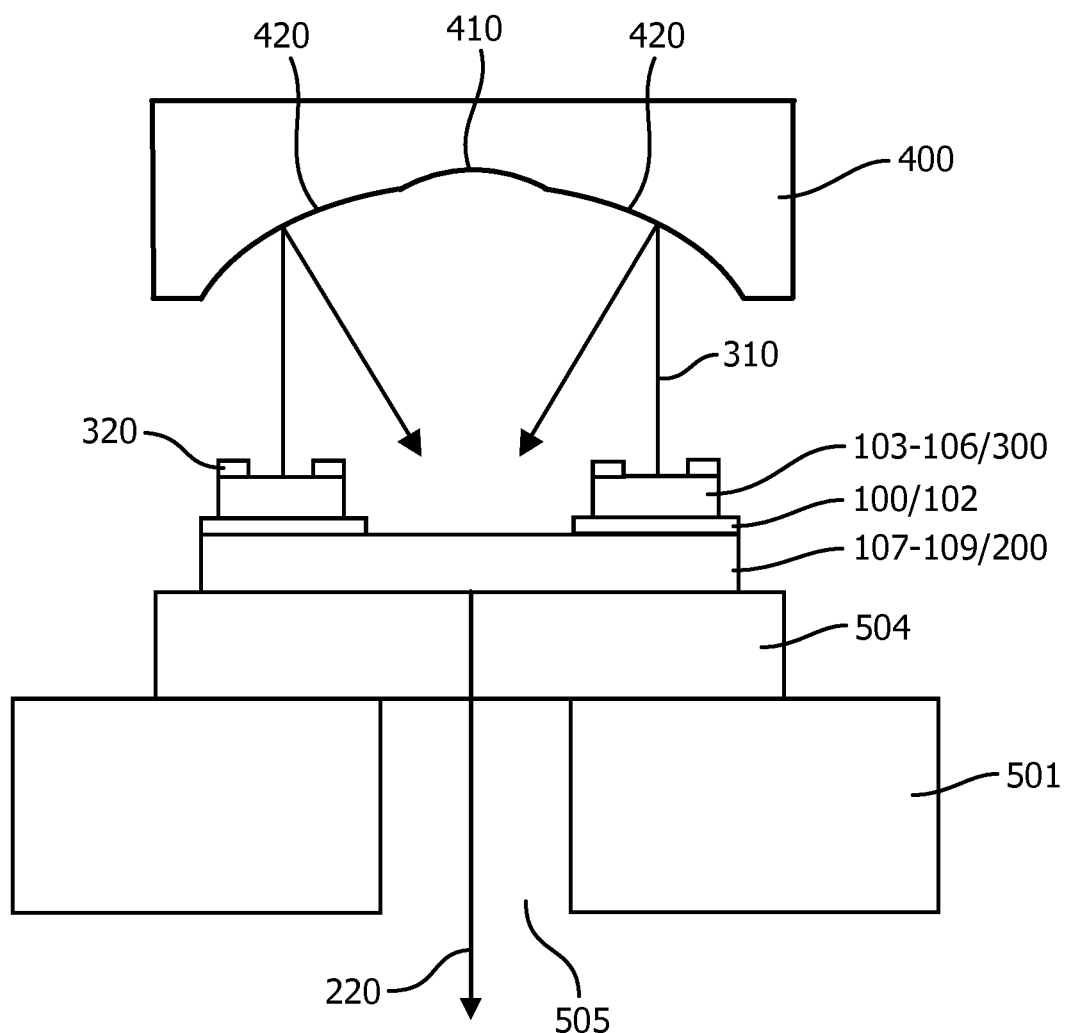
FIG. 10 a further example of the proposed laser device.

FIG. 10 shows a further embodiment of the proposed laser device. In this embodiment the layer sequence (layers 103-106) of the VCSELs 300 is formed on top of the layer sequence (layers 107-109) of the VECSEL separated by etch stop layer 100 and n-doped current distribution layer 102. The p-contacts 320 are realized on top of the VCSELs 300 by ring contacts. A further bond pad 340 for the n-contact is formed on current distribution layer 102. The layer sequence of the VECSEL is arranged on an optically transparent heat spreading layer 504, which may be made e.g. of diamond, sapphire or SiC. This layer is mounted on a heat sink 501, which comprises a though-hole 505 allowing laser emission 220 of the VECSEL through the through-hole 505 of the heat sink 501. With this design mirror element 400 can be formed of an optically non-transparent material, e.g. of a metal. Center region 410 forming the external mirror of the VECSEL is HR (high reflectivity)-coated for $\lambda_{VECSEL}$ and outer region 420 is HR-coated for $\lambda_{VCSEL}$.

While the invention has been illustrated and described in detail in the drawings and forgoing description, such illustration and description are to be considered illustrative or exemplary and not restrictive; the invention is not limited to the disclosed embodiments. For example, the mirror element may have any shape for realizing the desired function and is not restricted to a spherical or parabolic shape. Furthermore, the layer structures of the VCSELs and VECSEL is not limited to the disclosed sequence. The pump lasers and the VECSEL(s) may also be manufactured on different wafers or substrates which are then combined to the proposed device. In addition to the elements and layers shown in the examples further elements or layers may be part of the proposed laser device. For example, an integration of functional VECSEL elements between layer 100 and layer 109 or on top of layer 109 is possible, for example etalons for longitudinal mode selection, polarizing layers for polarization-stabilization, apertures for transversal mode selection, saturable absorbers for mode locking and so on. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. In particular, all claims of the device can be freely combined. Any reference signs in the claims should not be construed as limiting the scope of the invention.

LIST OF REFERENCE SIGNS 100 etch stop layer
101 etch stop layer 102 current distribution layer
103 n-doped DBR
104 active region of VCSEL
105 p-doped DBR
106 cap layer
107 undoped DBR
108 active region of VECSEL
109 cap layer
120 semiconductor chip
200 VECSEL
210 optical axis
220 VECSEL laser emission
300 VCSEL
310 pump radiation
320 p-contact
330 n-contact
340 bond pad
350 bond wires
400 mirror element (free-form optic)
401 first surface of mirror element
402 second surface of mirror element
410 center region
420 outer region
421 specially shaped outer region
430 micro-lenses
500 substrate
501 sub-mount heat sink
502 metal
503 solder
504 optically transparent heat spreader
505 through-hole

The invention claimed is:

1. An optically pumped vertical external-cavity surface-emitting laser device comprising at least one vertical external-cavity surface-emitting laser and several pump laser diodes, said vertical external-cavity surface-emitting laser comprising:
a layer stack forming at least a first end mirror and an active region of the vertical external-cavity surface-emitting laser, and
a second end mirror forming an external cavity of the vertical external-cavity surface-emitting laser,
said pump laser diodes being arranged to optically pump said active region by reflection of pump radiation at a mirror element, wherein said mirror element is arranged on an optical axis of the vertical external-cavity surface-emitting laser and is designed to concentrate said pump radiation in the active region and to form the second end mirror of the vertical external-cavity surface-emitting laser, wherein the pump laser diodes are arranged to direct the pump radiation substantially parallel to the optical axis towards the mirror element such that a pump spot provided by the pump laser diodes is automatically aligned with an optical mode of the vertical external-cavity surface emitting laser;
wherein said pump laser diodes are formed on a first chip and said layer stack of the vertical external-cavity surface-emitting laser is formed on a second chip, said first and second chip being mounted on a common submount or heat sink.

2. The device according to claim 1, wherein said pump laser diodes are vertical cavity surface emitting lasers.

3. The device according to claim 2, wherein said vertical cavity surface emitting lasers and said layer stack of the vertical external-cavity surface-emitting laser are formed on the same chip.

4. The device according to claim 3, wherein said vertical cavity surface emitting lasers and said layer stack of the vertical external-cavity surface-emitting laser originate from the same layer sequence on the chip.

5. The device according to claim 4, wherein said layer sequence comprises a first sequence of layers forming a layer structure of the vertical cavity surface emitting lasers and a second sequence of layers forming a layer structure of the layer stack of the vertical external-cavity surface-emitting laser, said first and second sequence of layers being separated by an etch stop layer.

6. The device according to claim 1, wherein said mirror element comprises a central region which forms said second end mirror and an outer region which is designed to reflect and concentrate said pump radiation in the active region of the of the vertical external-cavity surface-emitting laser diode.

7. The device according to claim 6, wherein said central region and said outer region are formed with different curvatures.

8. The device according to claim 1, wherein said mirror element comprises an outer region, said outer region being is designed to generate an intensity distribution of the pump radiation in the active region-of the vertical external-cavity surface-emitting laser which intensity distribution matches a laser mode of the vertical external-cavity surface-emitting laser.

9. The device according to claim 1, wherein said mirror element comprises a central region, said central region being designed to generate a laser mode which does not have a Gaussian intensity profile in the vertical external-cavity surface-emitting laser.

10. The device according to claim 1, wherein a body of said mirror element is made of a material optically transparent for laser radiation of the vertical external-cavity surface-emitting laser.

* * * * *